US011367743B2

(12) United States Patent
Yang et al.

(10) Patent No.: US 11,367,743 B2
(45) Date of Patent: Jun. 21, 2022

(54) IMAGE SENSOR WITH SHARED MICROLENS BETWEEN MULTIPLE SUBPIXELS

(71) Applicant: OmniVision Technologies, Inc., Santa Clara, CA (US)

(72) Inventors: Xiaodong Yang, San Jose, CA (US); Guansong Liu, San Jose, CA (US); Peng Lin, Pleasanton, CA (US); Chin Poh Pang, Pleasanton, CA (US); Da Meng, Fremont, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 263 days.

(21) Appl. No.: 16/666,129

(22) Filed: Oct. 28, 2019

(65) Prior Publication Data

US 2021/0126033 A1   Apr. 29, 2021

(51) Int. Cl.
*H01L 27/146* (2006.01)
*H04N 5/232* (2006.01)
*H04N 9/04* (2006.01)

(52) U.S. Cl.
CPC .. *H01L 27/14627* (2013.01); *H01L 27/14621* (2013.01); *H04N 5/232122* (2018.08); *H04N 9/0455* (2018.08); *H01L 27/14645* (2013.01)

(58) Field of Classification Search
CPC ......... H01L 27/14627; H01L 27/14621; H01L 27/14645; H01L 27/14605; H01L 27/14685; H04N 5/232122; H04N 9/0455; H04N 5/347; H04N 5/36961; H04N 5/345; H04N 9/04555; H04N 5/374
See application file for complete search history.

(56) References Cited

U.S. PATENT DOCUMENTS

| | | |
|---|---|---|
| 5,890,095 A | 3/1999 | Barbour et al. |
| 7,002,627 B1 | 2/2006 | Raffy et al. |
| 8,530,266 B1 | 9/2013 | Chen et al. |
| 9,443,899 B1 | 9/2016 | Liu et al. |
| 9,807,294 B2 | 10/2017 | Liu et al. |
| 10,015,389 B2 | 7/2018 | Lu et al. |
| 10,260,866 B2 | 4/2019 | Kadambi et al. |
| 10,334,189 B1 * | 6/2019 | Xu .......................... H04N 5/363 |

(Continued)

OTHER PUBLICATIONS

Jang, J., et al., "Sensor-Based Auto-Focusing System Using Multi-Scale Feature Extraction and Phase Correlation Matching," Sensors, 2015, vol. 15, pp. 5747-5762.

(Continued)

*Primary Examiner* — Lin Ye
*Assistant Examiner* — Tuan H Le
(74) *Attorney, Agent, or Firm* — Christensen O'Connor Johnson Kindness PLLC (57) ABSTRACT

An image sensor pixel includes a plurality of photodiodes, a shared microlens, and a plurality of microlenses. The plurality of photodiodes are arranged as a photodiode array with each of the plurality of photodiodes disposed within a semiconductor material. The shared microlens is optically aligned with a group of neighboring photodiodes included in the plurality of photodiodes. Each of the plurality of microlenses are optically aligned with an individual one of the plurality of photodiodes other than the group of neighboring photodiodes. The plurality of microlenses laterally surrounds the shared microlens.

21 Claims, 6 Drawing Sheets

(56) References Cited

U.S. PATENT DOCUMENTS

| | | |
|---|---|---|
| 2015/0358597 A1 | 12/2015 | Pang et al. |
| 2016/0150199 A1 | 5/2016 | Wu et al. |
| 2017/0171470 A1* | 6/2017 | Sakioka ............ H01L 27/14623 |
| 2019/0096945 A1 | 3/2019 | Lu et al. |
| 2020/0280659 A1* | 9/2020 | Galor Gluskin ..... H04N 5/3535 |

OTHER PUBLICATIONS

Kadambi, A., et al., "Polarized 3D: High-Quality Depth Sensing with Polarization Cues," The IEEE International Conference on Computer Vision (ICCV), 2015, 9 pages.

Yuffa, A.J., et al., "Three-dimensional facial recognition using passive long-wavelength infrared polarimetric imaging," Applied Optics, vol. 53, No. 36, Dec. 2014, 9 pages.

\* cited by examiner

IMAGE SENSOR WITH SHARED MICROLENS BETWEEN MULTIPLE SUBPIXELS

TECHNICAL FIELD

This disclosure relates generally to image sensors, and in particular but not exclusively, relates CMOS image sensors and applications thereof.

BACKGROUND INFORMATION

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Embodiments of an apparatus, system, and method each including or otherwise related to an image sensor with a shared microlens between multiple subpixels are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Embodiments described herein utilize an image sensor with an architecture including a shared microlens disposed between multiple subpixels of an individual image pixel to provide a single sensor solution that enables multi-directional phase detection auto focus (PDAF) for every image pixel included in the image sensor as well as full size resolution recovery and subpixel binning. In some embodiments, each image pixel of the image sensor may include a plurality of subpixels that collectively surround a phase detection pixel. The phase detection pixel may include a shared microlens that is optically aligned with a group of neighboring photodiodes included in a plurality of photodiodes of the image sensor. Each of the plurality of subpixels may include a subpixel color filter that is optically disposed between the plurality of photodiodes, other than the group of neighboring photodiodes, and a plurality of microlenses. In such an embodiment, the plurality of microlenses of a given image pixel may collectively surround the shared microlens. The phase detection pixel for each image pixels may be configured to determine whether a point of interest (POI) within the image frame is in focus and may provide multi-directional guidance as to how an objective lens of an imaging system should be adjusted when the POI is out of focus. Advantageously, embodiments described herein provide a single sensor solution for dense and omni-directional phase difference calculations for substantially instant autofocus, without necessarily needing fine-tuning via contrast detection, and depth mapping.

FIGS. 1A-1D illustrate representative views of an image sensor 100. It is appreciated that the views presented in FIGS. 1A-1D may omit certain elements of image sensor 100 to avoid obscuring details of the disclosure. In other words, not all elements of image sensor 100 may be labeled, illustrated, or otherwise shown within an individual one of FIGS. 1A-1-D. It is further appreciated that in some embodiments, image sensor 100 may not necessarily include all elements shown in FIGS. 1A-1D.

Figure 1A:
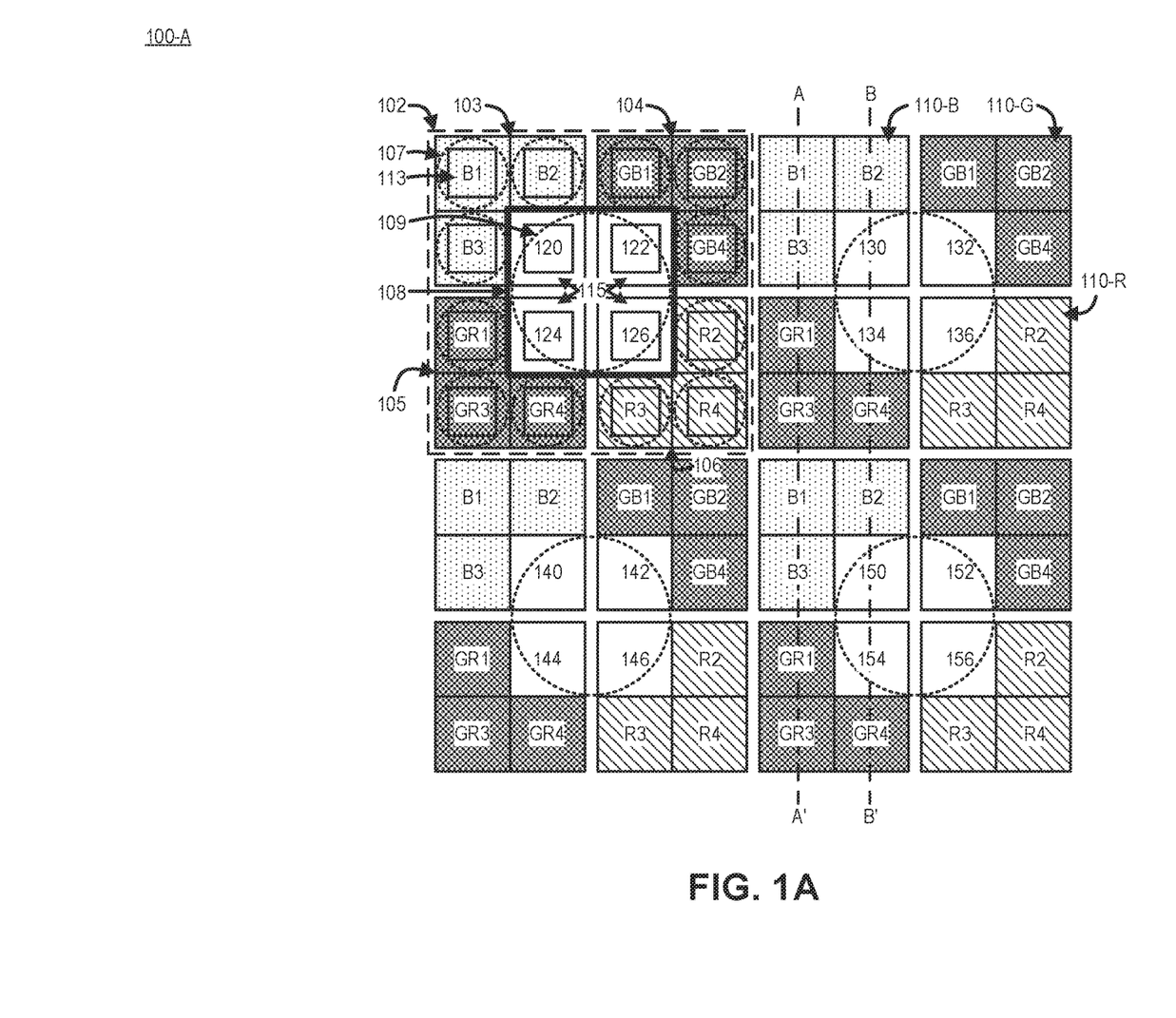
FIG. 1A illustrates a top view of an image sensor with a shared microlens between multiple subpixels, in accordance with the teachings of the present disclosure.
Figure 1B:
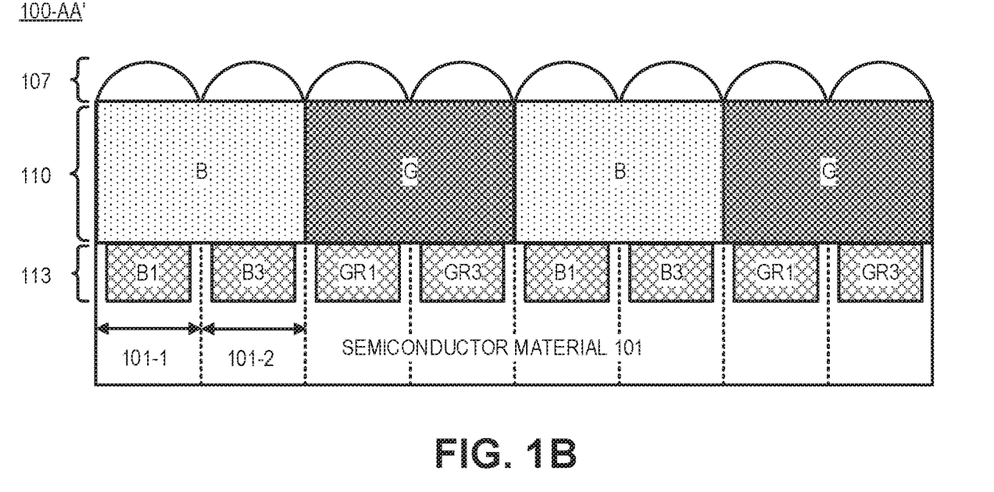
FIGS. 1B-1C illustrate different cross-sectional views of an image sensor with a shared microlens between multiple subpixels, in accordance with the teachings of the present disclosure.
Figure 1C:
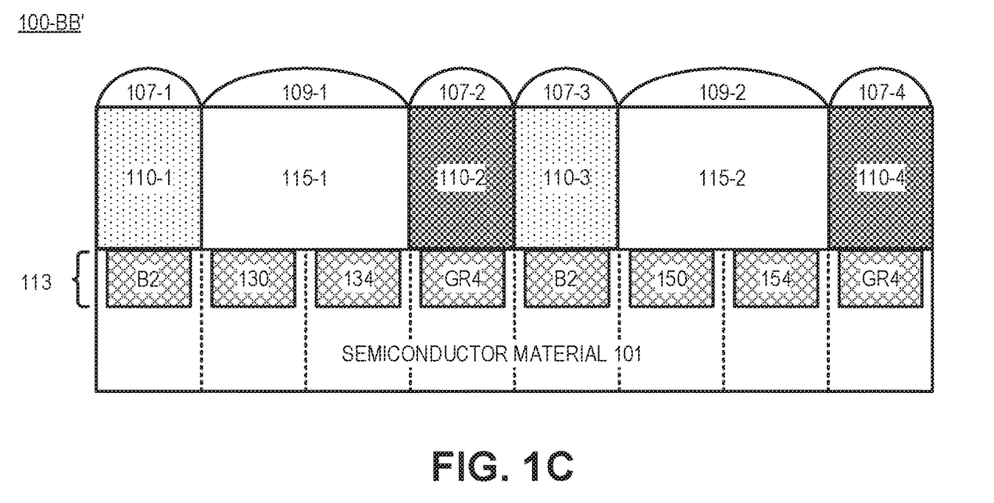

FIG. 1A illustrates a top view 100-A of image sensor 100 with a shared microlens 109 between multiple subpixels (e.g., 103, 104, 105, 106) of an image pixel 102, in accordance with the teachings of the present disclosure. Image sensor 100 includes a plurality of photodiodes 113 (e.g. B1, B2, B3, GB1, GB2, GB4, GR1, GR3, GR4, R2, R3, R4, 120, 122, 124, 126, 130, 132, 134, 136, 140, 142, 144, 146, 150, 152, 154, 156, and so on) arranged in rows and columns to form a photodiode array. In some embodiments, the plurality of photodiodes 113 are arranged in a regular, repeating manner such that the plurality of photodiodes are positioned within a semiconductor material at regular intervals to form a photodiode array with a square or rectangular shape via rows and columns of photodiodes. In some embodiments individual photodiodes included in the plurality of photodiodes 113 may correspond to doped regions within the respective portions of the semiconductor material that are collectively responsive to incident light (e.g., the doped regions may form a PN junction that generates image charge proportional to a magnitude or intensity of the incident light). It is appreciated that each of the plurality of photodiodes 113 are disposed in semiconductor material (see, e.g., FIGS. 1B and 1C) and are optically aligned with color filters included in one of a plurality of subpixels (e.g., 103, 104, 105, 106, and the like) or a phase detection pixel (e.g., 108) for a given image pixel (e.g., 102). Thus, for the sake of clarity, view 100-A illustrated in FIG. 1A generally refers to portions of a given subpixel or phase detection pixel by the labeled photodiode reference without showing an exemplary size or shape of a given photodiode. However, it is appreciated that such exemplary views are shown in FIGS. 1B-1D.

Referring back to FIG. 1A, image pixel 102 is representative of any individual image pixel included in a plurality of image pixels that collectively form image sensor 100. Image pixel 102 includes a phase detection pixel 108 that is surrounded by a plurality of subpixels (e.g., subpixels 103, 104, 105, and 106). Phase detection pixel 108 includes a shared microlens 109 optically aligned with a group of neighboring photodiodes (e.g., 120, 122, 124, and 126) included in the plurality of photodiodes 113. In some embodiments, the shared microlens 109 extends over approximately two rows and two columns included in the photodiode array. Phase detection pixel 108 also includes a first color filter 115 optically aligned with the group of neighboring photodiodes. The first color filter 115 is disposed between the group of neighboring photodiodes and the shared microlens 109 as shown in FIG. 1C.

As illustrated in FIG. 1A, image pixel 102 is a full color image pixel (e.g., capable of generating image signals in response to incident light that may collectively represent at least the visible portion of the electromagnetic spectrum) and includes the plurality of subpixels (e.g., subpixels 103, 104, 105, and 106) that collectively surround phase detection pixel 108. Image pixel 102 further includes a plurality of microlenses 107 that are each optically aligned with an individual one of the plurality of photodiodes 113 other than the group of neighboring photodiodes (e.g., B1, B2, B3, GB1, GB2, GB4, GR1, GR3, GR4, R2, R3, R4, and the like, but not photodiodes included in any phase detection pixel 108). In other words, individual microlenses included in the plurality of microlenses 107 extend over approximately one row and one column of the photodiode array. In some embodiments, individual microlenses included in the plurality of microlenses 107 are unshared with respect to the plurality of photodiodes 113 and thus respectively direct light towards a single one of the plurality of photodiodes 113. Based on the arrangement of the plurality of subpixels and phase detection pixel of image pixel 102, the plurality of microlenses 107 laterally surrounds the shared microlens 109.

In some embodiments there is a one-to-one ratio between the number plurality of microlens 107 included in image pixel 102 and the number of photodiodes, minus the group of neighboring photodiodes (e.g., photodiodes 120, 122, 124, and 126). Furthermore, it is appreciated that the term "laterally surrounds" does not necessarily mean fully encapsulates. Rather, as shown in FIG. 1A, there may be spacing and/or a separation distance between individual photodiodes, microlenses, and color filters in accordance with embodiments of the disclosure. Further still, in some embodiments, other components (e.g., vias, wiring, circuitry, and the like) may be disposed within the spacing. Each of the microlenses (e.g., plurality of microlens 107 and/or shared microlens 109) may be formed of a polymer (e.g., polymethylmethacrylate, polydimethylsiloxane, etc.) or other material and be shaped to have optical power for converging, diverging, or otherwise directing light incident upon the microlenses through a corresponding optically aligned one of the color filters (e.g., plurality of subpixel color filters 110, first color filter 115, and the like) to a respective one or more photodiodes included in the plurality of photodiodes 113.

To facilitate being a full color image pixel, image pixel 102 includes a plurality of subpixel color filters 110 that have a respective spectral photoresponse. The term "spectral photoresponse" describes the portion of the electromagnetic spectrum that the color filter (e.g., subpixel color filter 110, first color filter 115, and the like) transmits. For example, a spectral photoresponse corresponding to green indicates that the color filter will transmit a portion of the electromagnetic spectrum corresponding to green while substantially absorbing other portions of the electromagnetic spectrum that do not correspond to green. Similarly, a spectral photoresponse corresponding to panchromatic or clear indicates that the color filter substantially transmits a portion of electromagnetic spectrum corresponding to the visible spectrum of light while substantially absorbing regions of the electromagnetic spectrum outside of the visible range (e.g., UV, IR, etc. if the photodiode has spectral response outside of the visible range).

In the illustrated embodiment, subpixel 103 is a first subpixel including a first subpixel color filter having a first spectral photoresponse, subpixel 104 is a second subpixel including a second subpixel color filter having a second spectral photoresponse, subpixel 105 is a third subpixel included a third subpixel color filter having a third spectral photoresponse, and subpixel 106 is a fourth subpixel including a fourth subpixel color filter having a fourth spectral photoresponse. As illustrated in FIG. 1A, the first subpixel color filter of the first subpixel 103 is laterally adjacent to the second subpixel color filter of the second subpixel 104 and the third subpixel color filter of the third subpixel 105. Further still, the first subpixel color filter of the first subpixel 103 is disposed diagonally from the fourth subpixel color filter of the fourth subpixel 106 and the second subpixel color filter of the second subpixel 104 is disposed diagonally from the third subpixel color filter of the third subpixel 105. In some embodiments, the second spectral photoresponse is substantially equal to the third spectral photoresponse. In the illustrated embodiment, the first spectral photoresponse corresponds to blue, the second and third spectral photoresponse each correspond to green, and the fourth spectral photoresponse corresponds to red. In some embodiments, the first color filter 115 of phase detection pixel 108 is disposed between the second subpixel color filter of the second subpixel 104 and the third subpixel color filter of the third subpixel 105. In one embodiment, the first color filter 115 has a spectral photoresponse that is substantially equal to the second and third spectral photoresponse. In the same or other embodiments, the spectral photoresponse of the first color filter 115 of phase detection pixel 108 corresponds to green or panchromatic.

In some embodiments the first color filter 115 may collectively represent four distinct color filters that each have a same spectral photoresponse. In the same or other embodiments, the plurality of subpixel color filters and the first color filter may have a different spectral photoresponse corresponding to any one of, or a combination of, red, green, blue, panchromatic (i.e., clear or white), yellow, cyan, magenta, or other colors. As illustrated in FIG. 1A, plurality of photodiodes 113 are arranged in groups of two-by-two patterns of photodiodes (e.g., four photodiodes per cell) that are distinct and separate from one another. Each two-by-two pattern of photodiodes includes the photodiodes for a given subpixel (e.g., B1, B2, and B3) and a photodiode for the phase detection pixel (e.g., 120). The portion of the two-by-two pattern that includes the photodiode for the phase detection pixel for each of the plurality of subpixels is optically aligned with respective color filter that are collectively referred to as the first color filter 115 that collectively have a lateral area greater than any individual color filter included in the plurality of color filters 110. In some embodiments a quarter of all photodiodes included in the plurality of photodiodes 113 are utilized to form the phase detection pixels of each image pixel to provide dense phase detection pixel location with accurate phase difference that may be used for auto focus and depth calculation. Advantageously, phase detection may be utilized when the external scene includes features that are diagonal, horizontal, and vertical relative to the image sensor plane.

It is appreciated that image sensor 100 may be fabricated by semiconductor device processing and microfabrication techniques known by one of ordinary skill in the art. In one embodiment, fabrication of image sensor 100 may include providing a semiconductor material (e.g., a silicon wafer having a front side and a back side), forming a mask or template (e.g., out of cured photo resist) on the front side of the semiconductor material via photolithography to provide a plurality of exposed regions of the front side of semiconductor material, doping (e.g., via ion implantation, chemical vapor deposition, physical vapor deposition, and the like) the exposed portions of the semiconductor material to form the plurality of photodiodes 113 that extend into semiconductor material from the front side of semiconductor material, removing the mask or template (e.g., by dissolving the cured photoresist with a solvent), and planarizing (e.g., via chemical mechanical planarization or polishing) the front side of semiconductor material. In the same or another embodiment, photolithography may be similarly used to form the plurality of subpixel color filters 110, the first color filters 115 (e.g., via cured pigmented polymers having a desired spectral photoresponse) the plurality of microlenses 107, and the shared microlens 109 (e.g., polymer based microlenses having a target shape and size formed from a master mold or template). It is appreciated that the described techniques are merely demonstrative and not exhaustive and that other techniques may be utilized to fabricate one or more components of image sensor 100.

FIG. 1B illustrates a cross-sectional view 100-AA' along line A-A' of image sensor 100 shown in FIG. 1A, in accordance with the teachings of the present disclosure. As illustrated, image sensor 100 includes the plurality of microlenses 107, the plurality of subpixel color filters 110, and the plurality of photodiodes 113 disposed in respective portions of semiconductor material 101 (e.g., silicon). Each of the plurality of subpixel color filters 110 (e.g., B) is optically aligned between a group of adjacent photodiodes (e.g., B1 and B3) and the plurality of microlenses 107. In other words, each of the plurality of subpixel color filters 110 extends across the group of the adjacent photodiodes. Each of the plurality of microlenses 107 is optically aligned with or otherwise extends across an individual one of the plurality of photodiodes 113.

In the illustrated embodiment, each of the respective portions of semiconductor material 101 (e.g., 101-1, 101-2, and the like) include a respective one of the plurality of photodiodes 113. It is appreciated that individual photodiodes included in the plurality of photodiodes 113 do not necessarily extend laterally across the entire cross-sectional area of the respective portions of semiconductor material 101. Rather, portions of semiconductor material 101 disposed between adjacent photodiodes (e.g., region of semiconductor material 101 between photodiodes B1 and B3) may be utilized to form additional structures within the semiconductor material 101 (e.g., isolation trenches, floating diffusion, and the like).

FIG. 1C illustrates a cross-sectional view 100-BB' along line B-B' of image sensor 100 shown in FIG. 1A, in accordance with the teachings of the present disclosure. As illustrated, image sensor 100 includes first color filter 115 (e.g., 115-1) disposed between the group of neighboring photodiodes (e.g., 130, 134) and the shared microlens 109 (e.g., 109-1). Similarly, the plurality of subpixel color filters 110 (e.g., 110-1) are optically disposed between the plurality of photodiodes 113 (e.g., B2) other than the group of neighboring photodiodes and the plurality of microlenses 107 (e.g., 107-1). As illustrated in FIG. 1A and shown in FIG. 1C, the plurality of subpixel color filters (e.g., 110-1 and 110-2) laterally surrounds the first color filter 115 (e.g., 115-1).

Figure 1D:
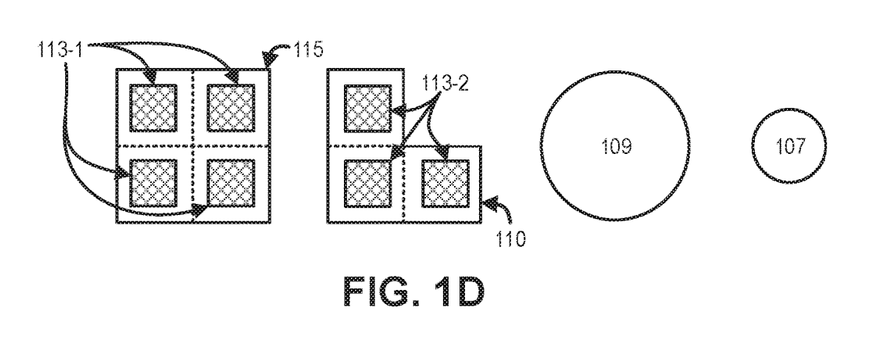
FIG. 1D illustrates a relative size comparison between a color filter aligned with a shared microlens, a subpixel color filter, a shared microlens, and an individual microlens included in an image sensor, in accordance with the teachings of the present disclosure.

FIG. 1D illustrates a relative size comparison between first color filter 115, subpixel color filter 110, shared microlens 109, and an individual microlens included in the plurality of microlenses 107 included in image sensor 100 shown in FIGS. 1A-1C, in accordance with the teachings of the present disclosure. Additionally, the relative size comparison illustrates a representative optical alignment between the plurality of photodiodes 113 with respect to both the first color filter 115 and the subpixel color filter 110. Specifically, the first color filter 115 is optically aligned with a group of neighboring photodiodes 113-1, which are arranged in a two-by-two pattern. The subpixel color filter 110 is optically aligned with a group of adjacent photodiodes 113-2. In some embodiments, the subpixel color filter 110 has an "L" shape that extends over at least three photodiodes included in the plurality of photodiodes 113. The group of neighboring photodiodes 113-1 include a first quantity of photodiodes greater than a second quantity of photodiodes included in the group of adjacent photodiodes 113-2. In the illustrated embodiment, the first quantity is four photodiodes and the second quantity is three photodiodes. Consequently, the first color filter 115 has a first lateral area that is greater than a second lateral area of the subpixel color filter 110. Additionally, since the shared microlens 109 extends over the group of neighboring photodiodes 113-1 while the microlens 107 extends over an individual one of the photodiodes, the shared microlens 109 has a lateral area greater than any individual microlens 107.

Figure 2:
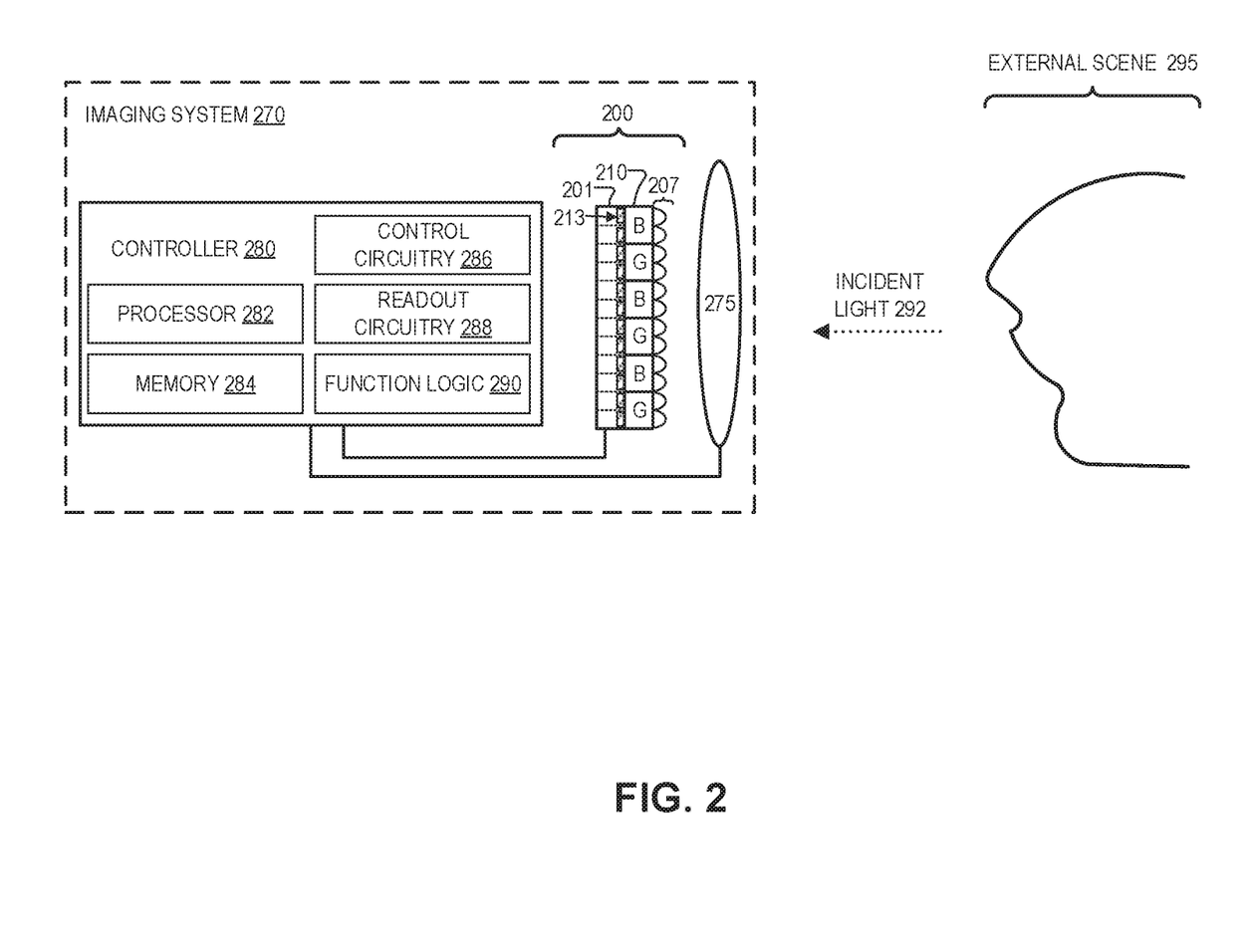
FIG. 2 is a functional block diagram of an imaging system including an image sensor with a shared microlens between multiple subpixels, in accordance with the teachings of the present disclosure.

FIG. 2 is a functional block diagram of an imaging system 270 including an image sensor 200 with a shared microlens between multiple subpixels, in accordance with the teachings of the present disclosure. Imaging system 270 is capable of focusing on a point of interest (POI) within an external scene 295 in response to incident light 292. Imaging system 270 includes image sensor 200 to generate electrical or image signals in response to incident light 292, objective lens(es) 275 with adjustable optical power to focus on one or more points of interest within the external scene 292, and controller 280 to control, inter alia, operation of image sensor 200 and objective lens(es) 275. Image sensor 200 is one possible implementation of image sensor 100 illustrated in FIGS. 1A-1D and includes a similar device architecture such as semiconductor material 201 with a plurality of photodiodes 213 disposed within respective portions of the semiconductor material 201, a plurality of subpixel color filters 210, and a plurality of microlenses 207. The controller 280 includes one or more processors 282, memory 284, control circuitry 286, readout circuitry 288, and function logic 290.

The controller 280 includes logic and/or circuitry to control the operation (e.g., during pre-, post-, and in situ phases of image and/or video acquisition) of the various components of imaging system 270. The controller 280 may be implemented as hardware logic (e.g., application specific integrated circuits, field programmable gate arrays, system-on-chip, etc.), software/firmware logic executed on a general purpose microcontroller or microprocessor, or a combination of both hardware and software/firmware logic. In one embodiment, the controller 280 includes the processor 282 coupled to memory 284 that store instructions for execution by the controller 280 or otherwise by one or more components of the imaging system 270. The instructions, when executed by the controller 280, may cause the imaging system 270 to perform operations that may associated with the various functional modules, logic blocks, or circuitry of the imaging system 270 including any one of, or a combination of, the control circuitry 286, the readout circuitry 288, the function logic 290, image sensor 200, objective lens 275, and any other element of imaging system 270 (illustrated or otherwise). The memory is a non-transitory computer-readable medium that may include, without limitation, a volatile (e.g., RAM) or non-volatile (e.g., ROM) storage system readable by controller 280. It is further appreciated that the controller 280 may be a monolithic integrated circuit, one or more discrete interconnected electrical components, or a combination thereof. Additionally, in some embodiments the one or more electrical components may be coupled to one another to collectively function as the controller 280 for orchestrating operation of the imaging system 270.

Control circuitry 286 may control operational characteristics of the image pixel array 213 (e.g., exposure duration, when to capture digital images or videos, and the like). Readout circuitry 288 reads or otherwise samples the analog signal from the individual photodiodes (e.g., read out electrical signals generated by each of the plurality of photodiodes 305 that are representative of image charge generated in response to incident light to generate a phase detection auto focus signal, read out image signals to capture an image frame or video, and the like) and may include amplification circuitry, analog-to-digital (ADC) circuitry, image buffers, or otherwise. In the illustrated embodiment, readout circuitry 288 is included in controller 280, but in other embodiments readout circuitry 288 may be separate from the controller 280. Function logic 290 is coupled to the readout circuitry 288 to receive the electrical signals to generate a phase-detection auto focus (PDAF) signal in response, generate an image in response to receiving image signals or data, and the like. In some embodiments, the electrical or image signals may be respectively stored as a PDAF signal or image data and may be manipulated by the function logic 290 (e.g., calculate an expected image signal, bin image signals, demosaic the image data, apply post image effects such as crop, rotate, remove red eye, adjust brightness, adjust contrast, or otherwise).

Figure 3:
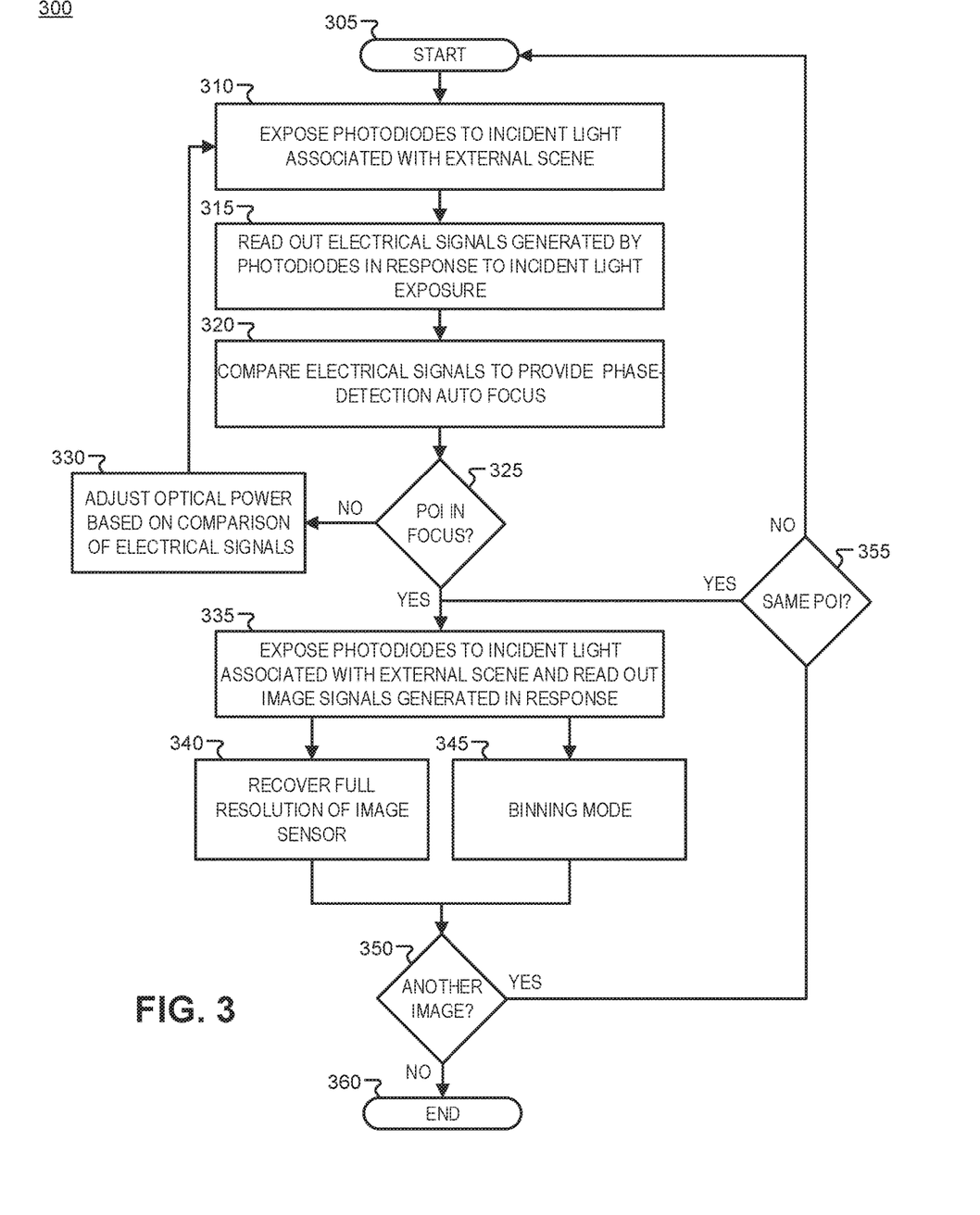
FIG. 3 shows an example method for capturing an image with an imaging system including an image sensor with a shared microlens between multiple subpixels, in accordance with the teachings of the present disclosure.

FIG. 3 shows an example method 300 for capturing an image with an imaging system including an image sensor with a shared microlens between multiple subpixels, in accordance with the teachings of the present disclosure. In some embodiments method 300 may be implemented by imaging system 270 illustrated in FIG. 2 and/or any of image sensor 100 illustrated in FIGS. 1A-1D or image sensor 200 illustrated in FIG. 2. It is appreciated that the numbered blocks of method 300, including blocks 305-360, may occur in any order and even in parallel. Additionally, blocks may be added to, or removed from, method 300 in accordance with the teachings of the present disclosure.

Block 305 illustrates initialization of method 300 upon receipt of a signal (e.g., a depressed shutter button of the imaging system) to capture an image or video frame representative of an external scene. During initialization, a point of interest (POI) of the external scene to be imaged by the image sensor may be provided (e.g., selected by a user of the imaging system), automatically detected (e.g., during a subsequent step with a phase detection auto-focus signal), or otherwise obtained. The POI may represent one or more regions of the external scene that are desired to be in focus.

Blocks 310-330 show steps for generating a phase detection auto focus (PDAF) signal using an image sensor with shared microlens between multiple subpixels and, if necessary, adjusting optical power of an objective lens to configure the imaging system to focus on one or more points of interest as illustrated in various embodiments of the disclosure. More specifically, the utilized image sensor (e.g., image sensor 100 or 200 illustrated respectively in FIGS. 1A-1D and FIG. 2) include a plurality of image pixels. Each of the image pixels include a plurality of subpixels that collectively surround a phase detection pixel. The phase detection pixel includes a group of neighboring photodiodes (e.g., four photodiodes arranged in a two-by-two pattern) that are optically aligned with a shared microlens.

Block 310 illustrates exposing the plurality of photodiodes to incident light associated with an external scene. In response to the incident light the plurality of photodiodes generates image charge proportional to the intensity of the incident light. The image charge is subsequently stored (e.g., in a floating diffusion) for each of the plurality of pixels and may subsequently be read out as electrical signals. It is appreciated that the term "electrical" and "image" signals may be used interchangeably and are both representative of the image charge that is generated by the plurality of photodiodes in response to incident light. In some embodiments, the modifier "electrical" or "image" that proceeds the term "signal" may respectively indicate that the signal is being used for auto focus/depth mapping or image/video capture.

Block 315 shows reading out electrical signals (e.g., via readout circuitry 288 illustrated in FIG. 2) in response to the incident light. Electrical signals may be read out individually from respective photodiodes included in the plurality of photodiodes (e.g., by transferring the image charge generated in each of the photodiodes as an electrical signal one row at a time to column storage capacitors, and then reading out the elements individually using a column decoder coupled to a multiplexer). Specifically, the electrical signals generated by the group of neighboring photodiodes included in the phase detection pixel for each image pixel included in the plurality of image pixels may be read out for generating a phase-detection auto focus signal.

Block 320 illustrates comparing the electrical signals, associated with phase detection pixels, to provide phase-detection auto focus for the imaging system. Function logic (e.g., as illustrated in FIG. 2) may be utilized to generate the PDAF signal based, at least in part, on a comparison between the electrical signals associated with the group of neighboring photodiodes that are optically aligned with a shared microlens. In one embodiment, the electrical signals associated with an individual phase detection pixel are grouped together and compared to one another to operate as a phase detector. In one embodiment, the function logic generates the PDAF signal by comparing the electrical signals between adjacent photodiodes included in the group of neighboring photodiodes of a phase detection pixel and further comparing the electrical signals between diagonal photodiodes included in the group of neighboring photodiodes.

Block 325 shows determining whether the point of interest is in focus based, at least in part, on the comparison between the electrical signals. In one embodiment, one or more phase images are generated based on the electrical signals. For example, if each phase detection pixel includes a shared microlens optically aligned with a group of neighboring photodiodes, the electrical signal from each photodiodes included in the group of neighboring photodiodes may be utilized to generate respective phase images (i.e., four phase images each representing a quadrant of the phase detection pixel when the group of neighboring photodiodes are arranged in a two-by-two pattern). Each of the phase images may be compared to generate a PDAF signal that provides omni-directional information as to whether the point of interest is in focus.

Block 325 proceeds to block 330 if the point of interest is not in focus and adjusts optical power (e.g., provided by an objective lens) based on the comparison of the electrical signals. In other words, the comparison allows for determining if the optical power of the objective lens results in the external scene being in focus, front focused, or back focused and provides instructions to adjust the optical power accordingly. Once the optical power of the objective lens is adjusted, block 330 proceeds to block 310 to start the process again of determining whether the point of interest is in focus. If the point of interest is in focus, block 325 proceeds to block 335 for capturing an image or video frame with the imaging system.

Block 335 illustrates exposing the plurality of photodiodes to incident light associated with the external scene and subsequently reading out (e.g., via readout circuitry 288 included in imaging system 270 illustrated in FIG. 2) image signals generated in response for capturing an image or video frame with the imaging system. It is appreciated that the integration time (i.e., exposure duration) for capturing an image or video frame may be different than when generating an autofocus signal. Accordingly, the term "image signal" is utilized when referring to image or video frame capture. Image signals may be read out from photodiodes included in the plurality of photodiodes for each of the plurality of subpixels included in each image pixel of the image sensor. Collectively, the subpixels of a given image pixel may be representative of a full color (i.e., representative of the visible spectrum of electromagnetic radiation) image pixel. However, since each image pixel also includes a phase detection pixel surrounded by the plurality of subpixels, image processing may be used to recover the full resolution of the image sensor, bin the image signals for increased sensitivity, and the like.

Block 340 shows recovering full resolution of the image sensor when one or more image pixels of the image sensor include a phase detection pixel that included a group of neighboring photodiodes that is surrounded by a plurality of subpixels. This may be achieved by calculating an expected image signal for each photodiode included in the group of neighboring photodiodes. In one embodiment, each of the plurality of subpixels included in a given image pixel includes a group of three photodiodes and one photodiode associated with the phase detection pixel. The expected image signal of the photodiode associated for the phase detection pixel is calculated based, at least in part, on the image signals associated with the group of three photodiodes.

Block 345 illustrates increasing the sensitivity of the image sensor by operating in a binning mode that combines image signals associated with an individual one of the plurality of image pixels included in the image sensor. In one embodiment, the image signals for each respective subpixel included in the plurality of subpixels are averaged for each image pixel included in the image sensor when operating in binning mode. This may be advantageous in terms of sensitivity, and in particular, may be desirable during video capture when the full resolution of the image sensor may not be desired.

Block 350 shows determining whether another image should be taken. If a signal, setting, or other configuration parameter indicates another image should be taken (e.g., a shutter button of the imaging system being depressed continuously), block 350 proceeds to block 355 to determine whether the same point of interest is selected or otherwise determined. If the same point of interest is selected, block 355 proceeds to block 335 for capturing an image based on the image type. However, if the same point of interest is not selected or it is desired to ensure focus of the point of interest then block 355 proceeds to block 305. If another image is not desired, block 350 proceeds to block 360 to end the image acquisition process.

Figure 4A:
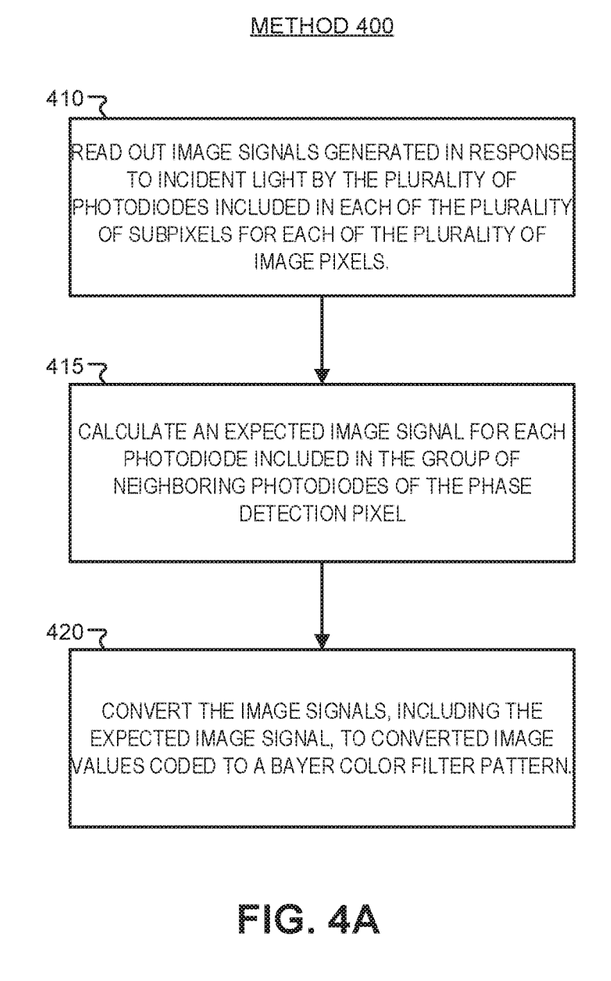
FIG. 4A shows an example method for recovering full resolution of an image sensor with a shared microlens between multiple subpixels, in accordance with the teachings of the present disclosure.

FIG. 4A shows an example method 400 for recovering full resolution of an image sensor with a shared microlens between multiple subpixels, in accordance with the teachings of the present disclosure. Method 400 may be one possible implementation process of block 340 illustrated in FIG. 3.

Referring back to FIG. 4A, block 410 illustrates reading out image signals generated in response to incident light by the plurality of photodiodes included in each of the plurality of subpixels for each image pixel included in the plurality of image pixels of an image sensor. The image sensor may have a configuration as described in embodiments of the disclosure (e.g., image sensor 100 illustrated in FIGS. 1A-1D), in which each image pixel includes a phase detection pixel surrounded by a plurality of subpixels.

Figure 4B:
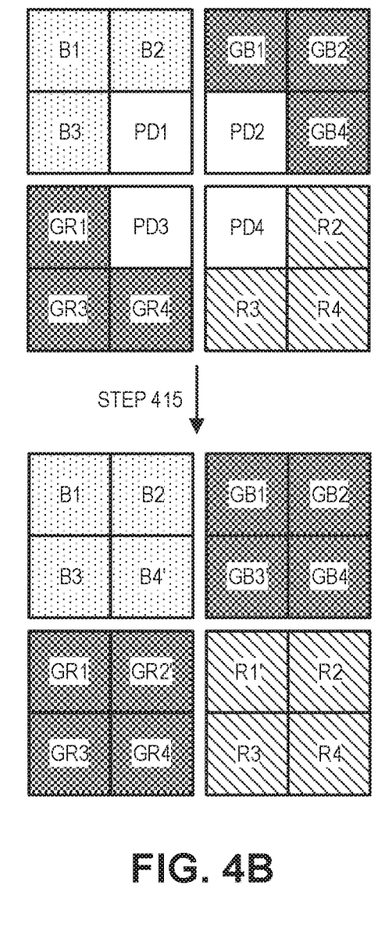
FIG. 4B illustrates a conversion process for calculating expected image signals for each photodiode included in a phase detection pixel of an image sensor with a shared microlens between multiple subpixels, in accordance with the teachings of the present disclosure.

Block 415 shows calculating an expected image signal for each photodiode included in the group of neighboring photodiodes of the phase detection pixel for each image pixel of the image sensor. For a given one of the plurality of image pixels, each of the plurality of subpixels may include a group of three photodiodes and further be associated with one of the photodiodes included in the group of neighboring photodiodes of the phase detection pixel. The expect image signal of the associated photodiode may be determined based on the image signals associated with the group of three photodiodes as shown in FIG. 4B. In some embodiments, other image processing or deep learning techniques may also be utilized to determine the expected image signal for each photodiode included in the phase detection pixels.

Block 420 illustrates converting the image signals, including the expected image signal, for each of the plurality of image pixels of the image sensor to converted image values coded to a Bayer color filter pattern. More specifically, one the expect image signals are known, the acquired image signals may be collectively representative a "4C" or "Quad Bayer" color filter pattern, which may be subsequently coded to a Bayer color filter pattern for further image processing.

FIG. 4B illustrates a conversion process for calculating expected image signals for each photodiode included in a phase detection pixel of an image sensor with a shared microlens between multiple subpixels, in accordance with the teachings of the present disclosure. More specifically, FIG. 4B illustrates a visualized output of a given image pixel before and after performing step 415 of method 400 illustrated in FIG. 4A. As shown, the expected image signal value of PD1 (i.e., B4') may be calculated as a function of the acquired image signals from photodiodes B1, B2, and B3. The expected image signal value of PD2 (i.e., GB3') may calculated as a function of the image signals acquired from the photodiodes GB1, GB2, and GB4). The expected image signal value of PD3 (i.e., GR2') may be calculated as a function of the acquired image signals from photodiodes GR1, GR3, and GR4. The expected image signal of PD4 (i.e., R1') may be calculated as a function of the image signals acquired from photodiodes R2, R3, and R4. Thus, it is appreciated that the expected image signals of the phase detection pixel may be determined using neighbor same-channel normal pixels and neighbor information. In some embodiments, the function to calculate the expected image signals may be an average or mean value. In the same or other embodiments, further image processing or deep learning techniques may be utilized to determine the expected image signal values.

Figure 5A:
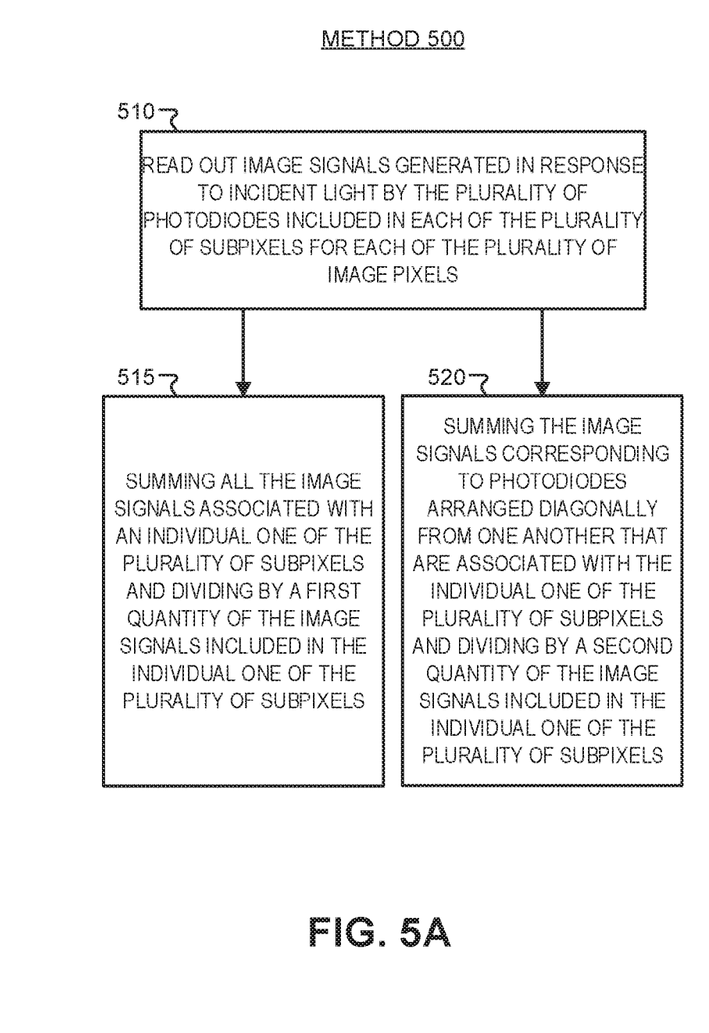
FIG. 5A shows an example method for binning image signals from an image sensor with a shared microlens between multiple subpixels, in accordance with the teachings of the present disclosure.

FIG. 5A shows an example method 500 for binning image signals from an image sensor with a shared microlens between multiple subpixels, in accordance with the teachings of the present disclosure. Method 500 one may one possible implementation of process block 345 illustrated in FIG. 3.

Referring back to FIG. 5A, block 510 illustrates reading out image signals generated in response to incident light by the plurality of photodiodes included in each of the plurality of subpixels for each image pixel included in the plurality of image pixels of an image sensor. The image sensor may have a configuration as described in embodiments of the disclosure (e.g., image sensor 100 illustrated in FIGS. 1A-1D), in which each image pixel includes a phase detection pixel surrounded by a plurality of subpixels. If the image sensor is operating in a binning mode (e.g., to increase sensitivity to incident light), block 510 proceeds to either block 515 or 520.

Block 515 shows, for a given image pixel, summing all of the image signals associated with an individual one of the plurality of subpixels and dividing by a first quantity of the image signals included in the individual one of the plurality of subpixels. In other words, an average of the image signals is taken to achieve greatest sensitivity. In one embodiment, a subpixel includes three photodiodes under a common color filter, the image signals of those three photodiodes are summed and subsequently divided by the first quantity (i.e., three) to effectively bin the output of the image pixels.

Block 520 illustrates, for a given image pixel, summing the image signals corresponding to the photodiodes arranged diagonally from one another that are associated with an individual one of the plurality of subpixels and dividing by a second quantity of the image signals included in the individual one of the plurality of subpixels. In other words, an average of the image signals is taken that also preserves symmetry of the photodiode arrangement. In one embodiment, each subpixel includes three photodiodes arranged as an "L" shape. In such an embodiment, only the image signals from the two photodiodes diagonally disposed from one another are summed and subsequently divided by the second quantity (i.e., two) to effectively bin the output of the image pixels.

Figure 5B:
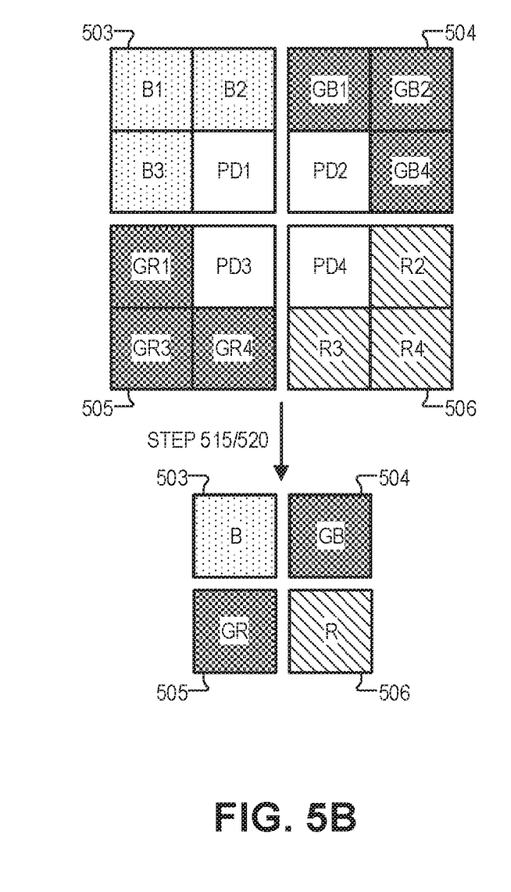
FIG. 5B illustrates a conversion process for summing image signals during a binning mode operation for an image sensor with a shared microlens between multiple subpixels, in accordance with the teachings of the present disclosure.

FIG. 5B illustrates a conversion process for summing image signals during a binning mode operation for an image sensor with a shared microlens between multiple subpixels, in accordance with the teachings of the present disclosure. More specifically, FIG. 5B illustrates a visualized output of a given image pixel including a first subpixel 503, a second subpixel 504, a third subpixel 505, and a fourth subpixel 506 before and after performing step 515 or 520 of method 500 illustrated in FIG. 5A. As shown, the binned image signal value of subpixel 503 may be calculated as a summation of image signals from photodiodes B1, B2, and B3 or B2 and B3 divided by the quantity of image signals (e.g., three or two). The binned image signal value of subpixel 504 may be calculated as a summation of image signals from photodiodes GB1, GB2, and GB4 or GB1 and GB4 divided by the quantity of image signals (e.g., three or two). The binned image signal value of subpixel 505 may be calculated as a summation of image signals from photodiodes GR1, GR3, and GR4 or GR1 and GR4 divided by the quantity of image signals (e.g., three or two). The binned image signal value of subpixel 506 may be calculated as a summation of image signals from photodiodes R2, R3, and R4 or R2 and R3 divided by the quantity of image signals (e.g., three or two). It is appreciated that this process may be completed for each image pixel included in the image sensor to provide a binned image or video frame.

The processes explained above may be implemented using software and/or hardware. The techniques described may constitute machine-executable instructions embodied within a tangible or non-transitory machine (e.g., computer) readable storage medium, that when executed by a machine (e.g., controller 120 of FIG. 1A) will cause the machine to perform the operations described. Additionally, the processes may be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor pixel, comprising:
   a plurality of photodiodes arranged as a photodiode array, each of the plurality of photodiodes disposed within a semiconductor material;
   a shared microlens optically aligned with a group of neighboring photodiodes included in the plurality of photodiodes;
   a plurality of microlenses, each optically aligned with an individual one of the plurality of photodiodes other than the group of neighboring photodiodes, and wherein the plurality of microlenses laterally surrounds the shared microlens;
   a first color filter optically disposed between the group of neighboring photodiodes and the shared microlens; and
   a plurality of subpixel color filters optically disposed between the plurality of photodiodes other than the group of neighboring photodiodes and the plurality of microlenses, and wherein the plurality of subpixel color filters laterally surrounds the first color filter,
   wherein each of the plurality of subpixel color filters have an "L" shape that extends over at least three photodiodes included in the plurality of photodiodes, and wherein the "L" shape of a given one of the plurality of subpixel color filters is disposed between at least three microlenses included in the plurality of microlenses and underlying photodiodes included in the plurality of photodiodes.

2. The image sensor pixel of claim 1, wherein the first color filter has a first lateral area, and wherein the first lateral area is greater than a corresponding second lateral area of any individual subpixel color filter included in the plurality of subpixel color filters.

3. The image sensor pixel of claim 1, wherein the plurality of subpixel color filters include a first subpixel color filter with a first spectral photoresponse, a second subpixel color filter with a second spectral photoresponse, a third subpixel color filter with a third spectral photoresponse, and a fourth subpixel color filter with a fourth spectral photoresponse.

4. The image sensor pixel of claim 3, wherein the first subpixel color filter is laterally adjacent to the second subpixel color filter and the third subpixel color filter, wherein the first subpixel color filter is disposed diagonally from the fourth subpixel color filter, wherein the second subpixel color filter is disposed diagonally from the third subpixel color filter, and wherein the second spectral photoresponse is substantially equal to the third spectral photoresponse.

5. The image sensor pixel of claim 3, wherein the first spectral photoresponse corresponds to blue, the second and the third spectral photoresponse each correspond to green, and the fourth spectral photoresponse corresponds to red.

6. The image sensor pixel of claim 5, wherein the first color filter has a spectral photoresponse corresponding to green or panchromatic.

7. The image sensor pixel of claim 1, wherein each of the plurality of subpixel color filters are optically aligned, respectively, with groups of adjacent photodiodes included in the plurality of photodiodes other than the group of neighboring photodiodes, wherein the groups of adjacent photodiodes collectively surround the group of neighboring photodiodes.

8. The image sensor pixel of claim 7, wherein the group of neighboring photodiodes include a first quantity of photodiodes greater than a second quantity of photodiodes included in any one of the groups of adjacent photodiodes.

9. The image sensor pixel of claim 8, wherein the first quantity is four photodiodes, and wherein the second quantity is three photodiodes.

10. An imaging system, comprising:
    an image sensor including a plurality of photodiodes arranged as a photodiode array to form a plurality of image pixels, each of the plurality of image pixels including:
    a phase detection pixel including a first color filter optically disposed between a shared microlens and a group of neighboring photodiodes included in the plurality of photodiodes;
    a plurality of subpixels collectively surrounding the phase detection pixel, each of the plurality of subpixels including a subpixel color filter optically disposed between a plurality of microlenses and the plurality of photodiodes other than the group of neighboring photodiodes; and
    a controller coupled to the image sensor, the controller including logic that when executed by the controller causes the imaging system to perform operations including:
    reading out image signals generated in response to incident light by the plurality of photodiodes included in each of the plurality of subpixels for each of the plurality of image pixels; and
    binning the image signals by averaging the image signals for each respective subpixel included in the plurality of subpixels for each of the plurality of image pixels, the binning including:
    summing the image signals corresponding to photodiodes arranged diagonally from one another that are associated with the individual one of the plurality of subpixels and dividing by a second quantity of the image signals included in the individual one of the plurality of subpixels.

11. The imaging system of claim 10, wherein the subpixel color filter included in each of the plurality of subpixels collectively laterally surround the first color filter for each of the plurality of image pixels.

12. The imaging system of claim 10, wherein the first color filter has a first lateral area, and wherein the first lateral area is greater than a corresponding second lateral area of the subpixel color filter.

13. The imaging system of claim 10, wherein each subpixel color filter included in the plurality of image pixels have an "L" shape that extends over at least three photodiodes included in the plurality of photodiodes.

14. The imaging system of claim 13, wherein the group of neighboring photodiodes included in the phase detection pixel include four photodiodes arranged in a two-by-two pattern.

15. The imaging system of claim 10, wherein for each of the plurality of image pixels, the subpixel color filter included in each of the plurality of subpixels is optically aligned with a group of adjacent photodiodes, and wherein the group of neighboring photodiodes include a first quantity of photodiodes greater than a second quantity of photodiodes included in the group of adjacent photodiodes.

16. The imaging system of claim 15, wherein the first quantity is four photodiodes and the second quantity is three photodiodes.

17. The imaging system of claim 10, wherein the plurality of photodiodes are arranged as rows and columns to form the photodiode array, wherein the shared microlens extends over approximately two rows and two columns included in the photodiode array, and wherein each of the plurality of microlenses extend over approximately one row and one column included in the photodiode array such that the shared microlens has a lateral area greater than any individual one of the plurality of microlenses.

18. The imaging system of claim 10, wherein for each of the plurality of image pixels the plurality of subpixels includes a first subpixel, a second subpixel, a third subpixel, and a fourth subpixel, wherein the subpixel color filter of the first subpixel, the second subpixel, the a third subpixel, and the fourth subpixel respectively have a first spectral photoresponse, a second spectral photoresponse, a third spectral photoresponse, and a fourth spectral photoresponse, wherein the second subpixel is disposed diagonally from the third subpixel, and wherein the second spectral photoresponse is substantially equal to the third spectral photoresponse.

19. The imaging system of claim 18, wherein the first color filter is disposed between the subpixel color filter of the second subpixel and the third subpixel color filter, and wherein the first color filter has a spectral photoresponse that is substantially equal to the second and third spectral photoresponse or corresponds to a panchromatic color.

20. The imaging system of claim 10, further comprising:
a controller coupled to the image sensor, the controller including logic that when executed by the controller causes the imaging system to perform operations including:
reading out electrical signals generated by the group of neighboring photodiodes included in the phase detection pixel in response to incident light of at least one of the plurality of image pixels; and
comparing the electrical signals to provide phase-detection auto focus (PDAF) for the imaging system.

21. The imaging system of claim 10, further comprising:
a controller coupled to the image sensor, the controller including logic that when executed by the controller causes the imaging system to perform operations including:
reading out image signals generated in response to incident light by the plurality of photodiodes included in each of the plurality of subpixels for each of the plurality of image pixels; and
calculating an expected image signal for each of the group of neighboring photodiodes for each of the plurality of image pixels, wherein for a given one of the plurality of image pixels, each of the plurality of subpixels includes a group of three photodiodes included in the plurality of photodiodes and one photodiode included in the group of neighboring photodiodes, and wherein the expected image signal of the one photodiode is based, at least in part, on the image signals associated with the group of three photodiodes.

* * * * *